(12) United States Patent
Wang (10) Patent No.: US 12,327,981 B2
(45) Date of Patent: Jun. 10, 2025

(54) VERTICAL CAVITY SURFACE EMITTING LASER DEVICE AND METHOD FOR MANUFACTURING THE SAME

(71) Applicant: TRIPLE WIN TECHNOLOGY(SHENZHEN) CO. LTD., Shenzhen (CN)

(72) Inventor: Cheng-Dong Wang, Shenzhen (CN)

(73) Assignee: TRIPLE WIN TECHNOLOGY(SHENZHEN) CO. LTD., Shenzhen (CN)

( * ) Notice: Subject to any disclaimer, the term of this patent is extended or adjusted under 35 U.S.C. 154(b) by 604 days.

(21) Appl. No.: 17/689,079

(22) Filed: Mar. 8, 2022

(65) Prior Publication Data
US 2022/0294185 A1   Sep. 15, 2022

(30) Foreign Application Priority Data
Mar. 12, 2021   (CN) .......................... 202120521977.3

(51) Int. Cl.
| | |
|---|---|
| H01S 5/042 | (2006.01) |
| H01S 5/02335 | (2021.01) |
| H01S 5/02355 | (2021.01) |
| H01S 5/183 | (2006.01) |

(52) U.S. Cl.
CPC ...... *H01S 5/04257* (2019.08); *H01S 5/02335* (2021.01); *H01S 5/02355* (2021.01); *H01S 5/04254* (2019.08); *H01S 5/18308* (2013.01); *H01S 2301/176* (2013.01)

(58) Field of Classification Search
CPC ............ H01S 5/04257; H01S 5/02335; H01S 5/02355; H01S 5/04256; H01S 5/183–18397
See application file for complete search history.

(56) References Cited

U.S. PATENT DOCUMENTS

| | | | |
|---|---|---|---|
| 6,184,066 B1* | 2/2001 | Chino ................. | H01S 5/04257 257/E21.511 |
| 2004/0099870 A1* | 5/2004 | Ono ....................... | H01L 33/38 257/79 |
| 2008/0031295 A1* | 2/2008 | Tanaka ................ | H01L 33/0093 438/46 |
| 2008/0191365 A1* | 8/2008 | Ueda .................... | H01S 5/02345 257/778 |
| 2014/0334512 A1* | 11/2014 | Kwon ................... | H01S 5/0427 372/45.01 |

(Continued)

*Primary Examiner* — Sean P Hagan
(74) *Attorney, Agent, or Firm* — ScienBiziP, P.C.

(57) ABSTRACT

A vertical cavity surface emitting laser (VCSEL) device and a method for manufacturing the VCSEL device without wire bonding process for the topmost positive electrode are disclosed. The device includes epitaxial layer, ohmic contact layer, positive electrode, first insulating layer, conductive layer, and negative electrode. The epitaxial layer includes first and second opposing surfaces, and sidewalls connected to first and second surfaces. The ohmic contact layer is disposed on the first surface and the positive electrode connected thereto is disposed on the second surface. The first insulating layer is disposed on the second surface and extends to the ohmic contact layer along the sidewall. The conductive layer is disposed on the first insulating layer corresponding to the sidewall/sidewalls which carry power for the positive electrode.

16 Claims, 13 Drawing Sheets

(56) References Cited

U.S. PATENT DOCUMENTS

| | | | |
|---|---|---|---|
| 2019/0237931 A1* | 8/2019 | Pao | H01S 5/0234 |
| 2020/0067270 A1* | 2/2020 | Müller | H01S 5/0236 |
| 2020/0153197 A1* | 5/2020 | Chen | H01S 5/04257 |
| 2021/0098962 A1* | 4/2021 | Hatzilias | H01S 5/04256 |

* cited by examiner

```
┌─────────────────────────────────────────────┐
│ Provide a device body, the device body      │
│ comprises an epitaxial layer and an ohmic   │
│ contacting layer, the epitaxial layer       │──S11
│ comprises a first surface, a second         │
│ surface opposite to the first surface, and  │
│ at least one sidewall connected to the      │
│ first surface and the second surface, the   │
│ ohmic contacting layer disposed on the      │
│ first surface                               │
└─────────────────────────────────────────────┘
                      │
                      ▼
┌─────────────────────────────────────────────┐
│ Dispose a negative electrode on a portion   │──S12
│ of the second surface                       │
└─────────────────────────────────────────────┘
                      │
                      ▼
┌─────────────────────────────────────────────┐
│ Dispose a first insulating layer on a       │
│ portion of the second surface without the   │
│ negative electrode, and extending to the    │──S13
│ ohmic contacting layer along the at least   │
│ one sidewall                                │
└─────────────────────────────────────────────┘
                      │
                      ▼
┌─────────────────────────────────────────────┐
│ Dispose a conductive layer on the first     │──S14
│ insulating layer corresponding to the at    │
│ least one sidewall                          │
└─────────────────────────────────────────────┘
                      │
                      ▼
┌─────────────────────────────────────────────┐
│ Dispose a positive electrode on the first   │
│ insulating layer corresponding to the       │
│ second surface, cause the positive          │──S15
│ electrode to be spaced from the negative    │
│ electrode, and cause the positive electrode │
│ to electrically connect to the ohmic        │
│ contacting layer through the conductive     │
│ layer                                       │
└─────────────────────────────────────────────┘
```

FIG. 13

VERTICAL CAVITY SURFACE EMITTING LASER DEVICE AND METHOD FOR MANUFACTURING THE SAME

FIELD

The disclosure relates to lasers, and more particularly, to a vertical cavity surface emitting laser (VCSEL) device and a method for manufacturing the VCSEL device.

BACKGROUND

An existing vertical cavity surface emitting laser (VCSEL) includes at least one device body and a substrate. A positive electrode and a negative electrode are respectively disposed on top and bottom surfaces of each device body. When the device body needs to be connected to the substrate, the positive electrode on the topmost surface is connected to the substrate through a wire. The negative electrode on the bottom surface is connected to the substrate through welding. By supplying electric power to the substrate of the finished VCSEL, a resonant cavity in the device body is excited to emit light vertically from the interior cavity.

However, a process of bonding by wire for connecting the positive electrode to the substrate is still needed. Furthermore, a bonding area needs to be reserved on the substrate for the bonding wire, which increases a size of the VCSEL and reduces a layout density of the device body on the substrate, this situation can be improved.

BRIEF DESCRIPTION OF THE DRAWINGS

Many aspects of the disclosure can be better understood with reference to the following drawings. The components are not necessarily drawn to scale, the emphasis instead being placed upon clearly illustrating the principles of the disclosure.

DETAILED DESCRIPTION

Implementations of the disclosure will now be described, by way of embodiments only, with reference to the drawings. It should be noted that the embodiments and the features of the present disclosure can be combined without conflict. Specific details are set forth in the following description to make the present disclosure fully understood. The embodiments are only some and not all the embodiments of the present disclosure. Based on the embodiments of the present disclosure, other embodiments obtained by a person of ordinary skill in the art without creative efforts shall be within the scope of the present disclosure.

Unless defined otherwise, all technical and scientific terms used herein have the same meaning as commonly understood by one of ordinary skill in the art. The terms used herein in the specification of the present disclosure are only for describing the embodiments, and are not intended to limit the present disclosure. The term "and/or" as used herein includes any combination of one or more related items.

In the embodiments of the present disclosure, and not as a limitation of the present disclosure, the term "connection" used in the specification and claims of the present disclosure is not limited to physical or mechanical connection, no matter direct connection or indirect connection. The terms of "up", "down", "above", "below", "left", "right", etc., are only used to indicate the relative positional relationship. When the absolute position of a described element changes, the relative positions correspondingly change.

Figure 1:
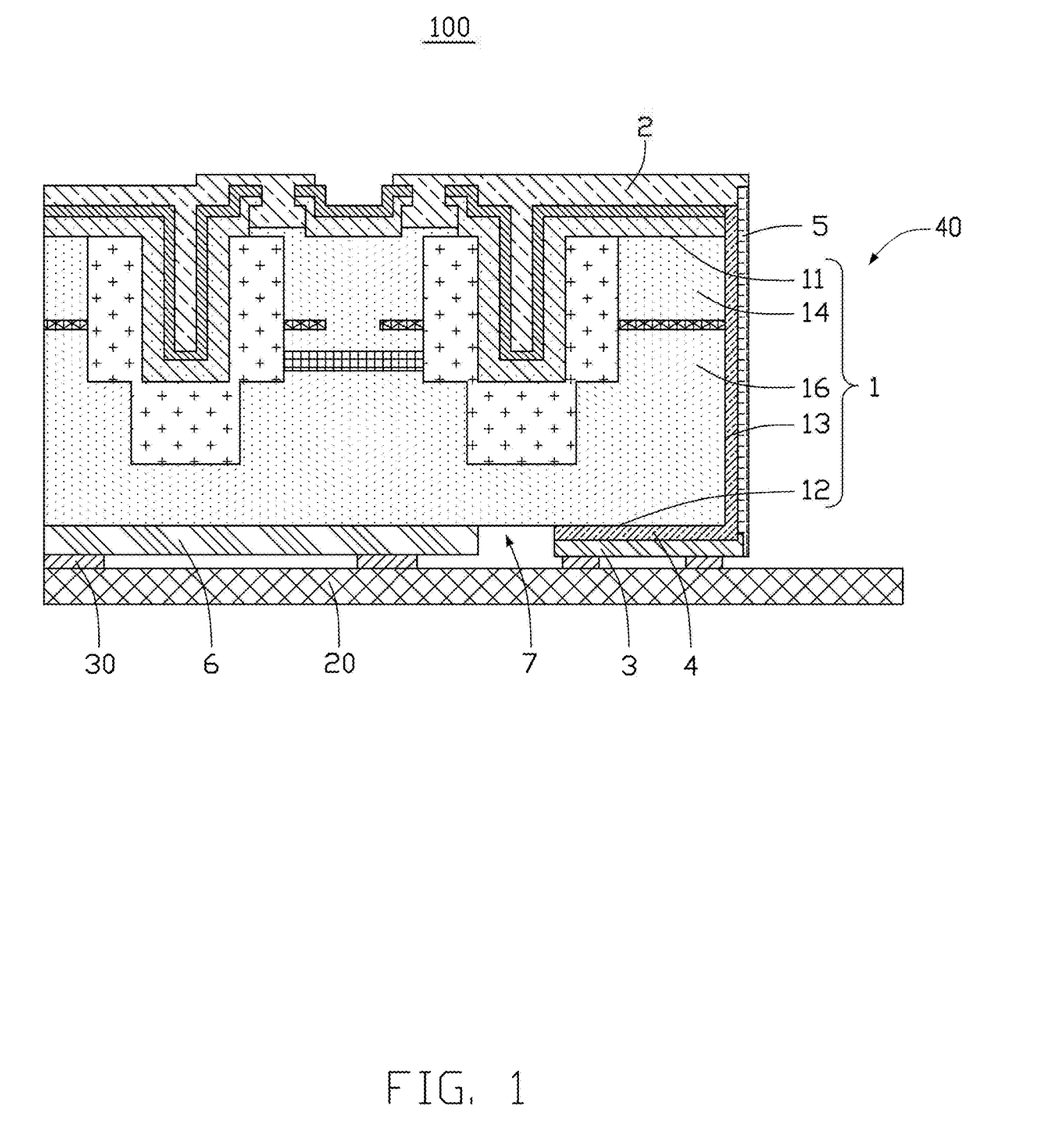
FIG. 1 is a diagrammatic view of an embodiment of a vertical cavity surface emitting laser (VCSEL) device according to the present disclosure.

FIG. 1 illustrates an embodiment of a VCSEL device 100, including at least one device unit 40. The device unit 40 includes an epitaxial layer 1, an ohmic contact layer 2, a positive electrode 3, a first insulating layer 4, a conductive layer 5, and a negative electrode 6. The epitaxial layer 1 includes a first surface 11, a second surface 12 opposite to the first surface 11, and at least one sidewall 13 connected to the first surface 11 and the second surface 12. The ohmic contact layer 2 is disposed on the first surface 11. The negative electrode 6 is disposed on a portion of the second surface 12. The first insulating layer 4 is disposed on another portion of the second surface 12 without the negative electrode 6, and the first insulating layer 4 further extends to the ohmic contact layer 2 along the sidewall 13. The positive electrode 3 is disposed on a surface of the first insulating layer 4 corresponding to the second surface 12. The conductive layer 5 is disposed on a surface of the first insulating layer 4 corresponding to the sidewall 13. The positive electrode 3 is connected to the ohmic contact layer 2 through the conductive layer 5. A short circuit between the positive electrode 3 and the epitaxial layer 1 is thus avoided. The negative electrode 6 is spaced from the positive electrode 3 to avoid a short circuit between the positive electrode 3 and the negative electrode 6.

Figure 4:
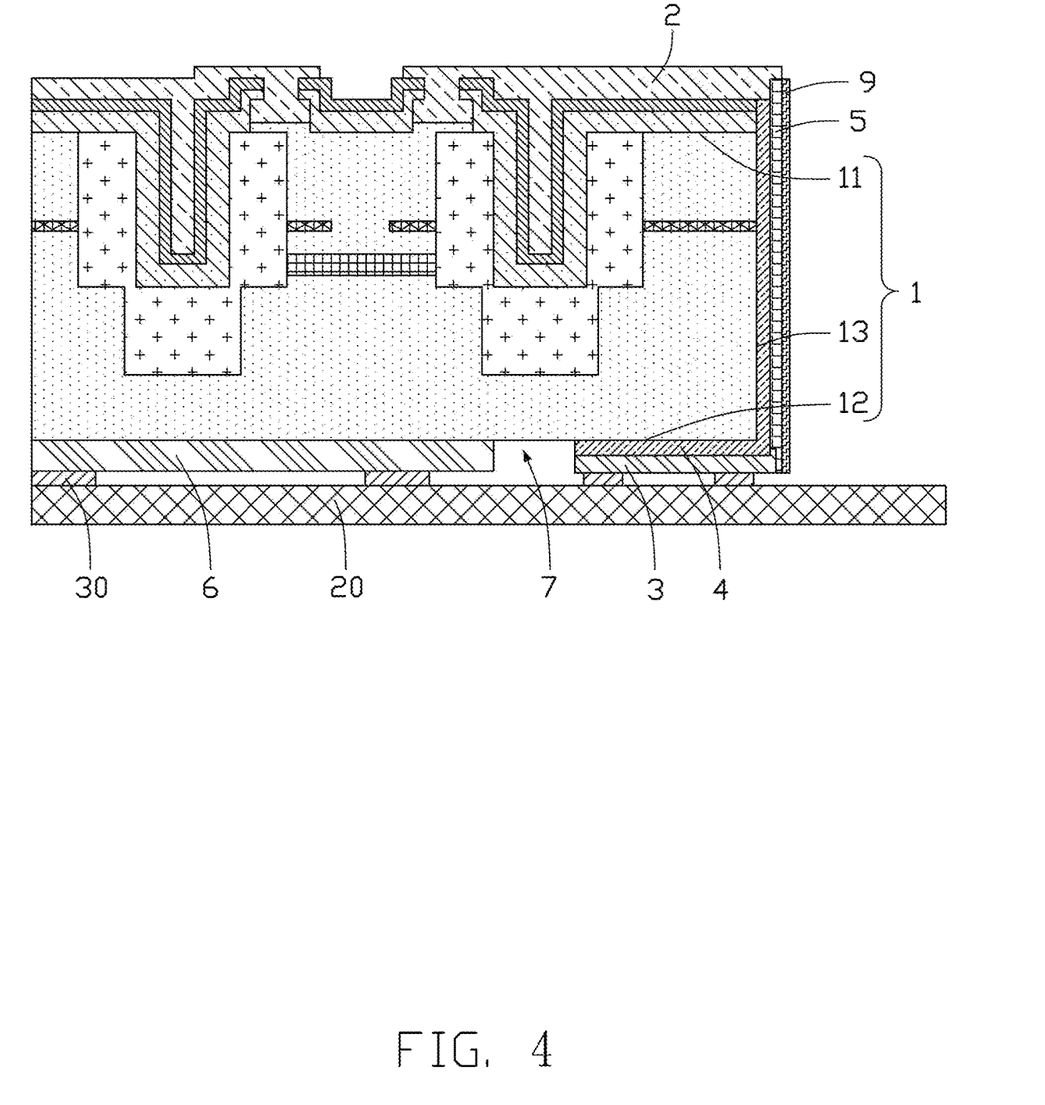
FIG. 4 is a diagrammatic view of another embodiment of a VCSEL device according to the present disclosure.

The positive electrode 3 and the negative electrode 6 are arranged on a single surface of the epitaxial layer 1, and then the conductive layer 5 is arranged on the sidewall 13 to electrically connect the positive electrode 3 to the ohmic contact layer 2. Referring to FIG. 4, since the positive electrode 3 and the negative electrode 6 are arranged on the single and same surface of the epitaxial layer 1, respective connections for the positive electrode 3 and the negative electrode 6 to the substrate 20 are more easily and conveniently formed later and a wire bonding process is avoided.

Referring to FIG. 1, a gap 7 is defined between the positive electrode 3 and the negative electrode 6 to avoid a short circuit between the two. The positive electrode 3 and the negative electrode 6 may be different shapes.

Figure 2:
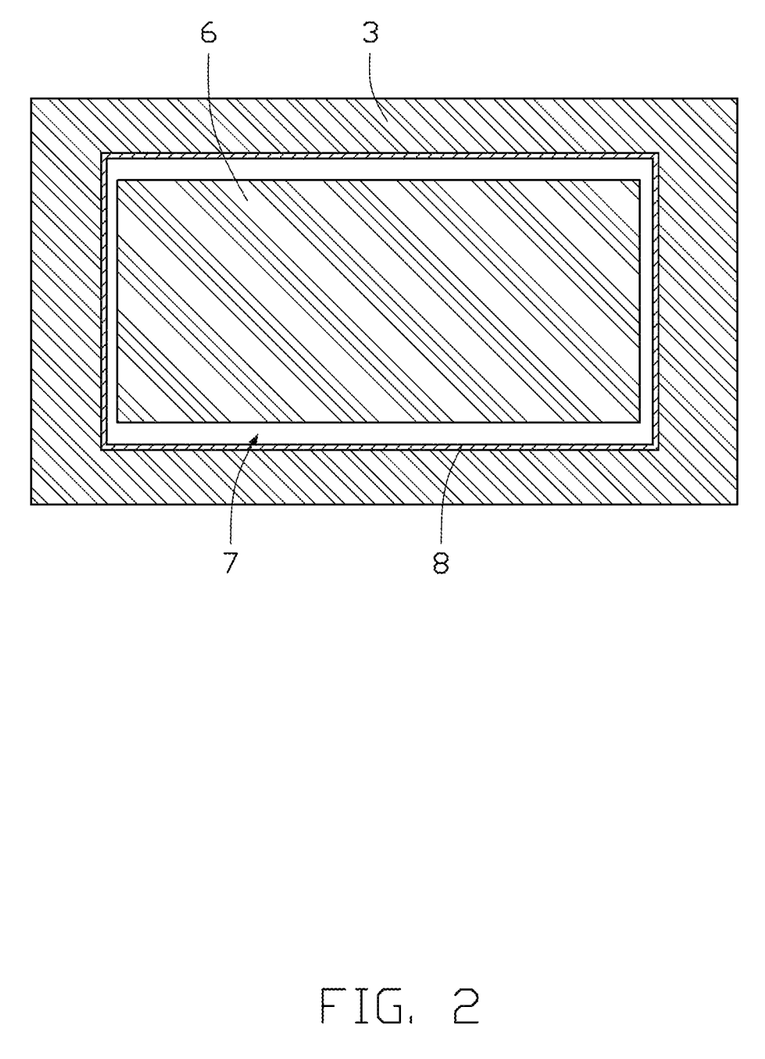
FIG. 2 is a diagrammatic view showing relative positions of a positive electrode and a negative electrode of the VCSEL device of FIG. 1 in one embodiment.

Referring to FIG. 2, in an embodiment, the positive electrode 3 surrounds the negative electrode 6. A shape of the negative electrode 6 is substantially rectangular, the positive electrode 3 is substantially in the form of a rectangular frame. The negative electrode 6 is disposed inside of the rectangular frame of positive electrode 3, and there is a certain distance between the negative electrode 6 and the positive electrode 3. At this time, the epitaxial layer 1 may be substantially a rectangular structure which includes four sidewalls 13, one conductive layer 5 being disposed on each sidewall 13. Therefore, the positive electrode 3 with the rectangular frame structure is electrically connected through four conductive layers 5 to the ohmic contact layer 2. The positive electrode 3 may be also in the form of an annular frame, which can be designed according to actual needs.

Figure 3:
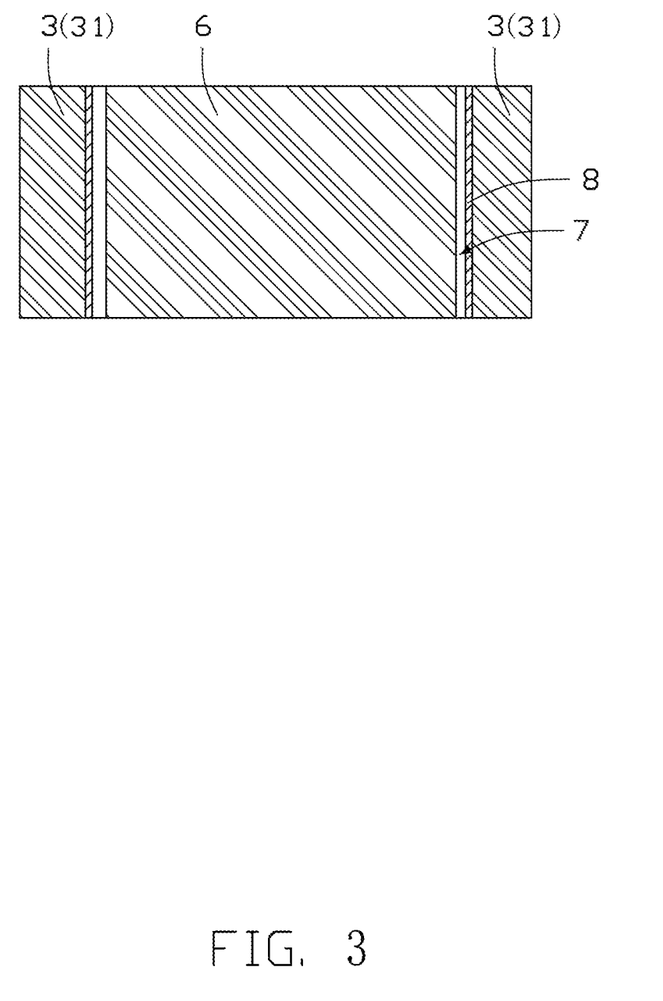
FIG. 3 is a diagrammatic view showing relative positions of a positive electrode and a negative electrode of the VCSEL device of FIG. 1 in another embodiment.

Referring to FIG. 3, in another embodiment, the positive electrode 3 includes two separate portions 31, the separate portions 31 are disposed at opposite ends of the negative electrode 6. The epitaxial layer 1 may be substantially a rectangular structure, including four sidewalls 13. Two of the conductive layers 5, disposed on opposite sidewalls 13, correspond to each separate portion of the positive electrode 3. Each of the two separate portions 31 of the positive electrode 3 is electrically connected to the ohmic contact layer 2 through a corresponding conductive layer 5.

Referring to FIGS. 2 and 3, a second insulating layer 8 is disposed between the positive electrode 3 and the negative electrode 6. The second insulating layer 8 infills the gap 7 between the positive electrode 3 and the negative electrode 6 either completely or at least partially, so as to ensure electrical isolation between the positive electrode 3 and the negative electrode 6.

In an embodiment, the second insulating layer 8 may be made of various non-conductive materials, such as polyamide or benzocyclobutene polymer (BCB).

In an embodiment, the first insulating layer 4 may be a thin aluminum oxide film. The high density of the aluminum oxide film, a purpose of insulation between the positive electrode 3 and the epitaxial layer 1 can be achieved by use of a very thin aluminum oxide film.

In an embodiment, the conductive layer 5 may be a metal conductive layer, the metal may be, but is not limited to, chromium (Cr), aluminum (Al), titanium (Ti), or copper (Cu), or any combination by metallization process.

Referring to FIG. 4, an electroplating layer 9 is disposed on a surface of the conductive layer 5 away from the first insulating layer 4. The electroplating layer 9 is formed by electroplating gold onto the surface of the conductive layer 5 away from the first insulating layer 4, so that the electroplating layer 9 is combined with the conductive layer 5, and thickens the conductive layer 5.

Referring to FIG. 1, the epitaxial layer 1 includes a first semiconductor layer 14, an active layer, and a second semiconductor layer 16 stacked in that order. The first semiconductor layer 14 includes the first surface 11, the second semiconductor layer 16 includes the second surface 12. The positive electrode 3 is electrically connected to the first semiconductor layer 14 through the ohmic contact layer. The negative electrode 6 is electrically connected to the second semiconductor layer 16.

In an embodiment, the first semiconductor layer 14 is a P-type semiconductor layer, and the second semiconductor layer 16 is an N-type semiconductor layer.

Figure 5:
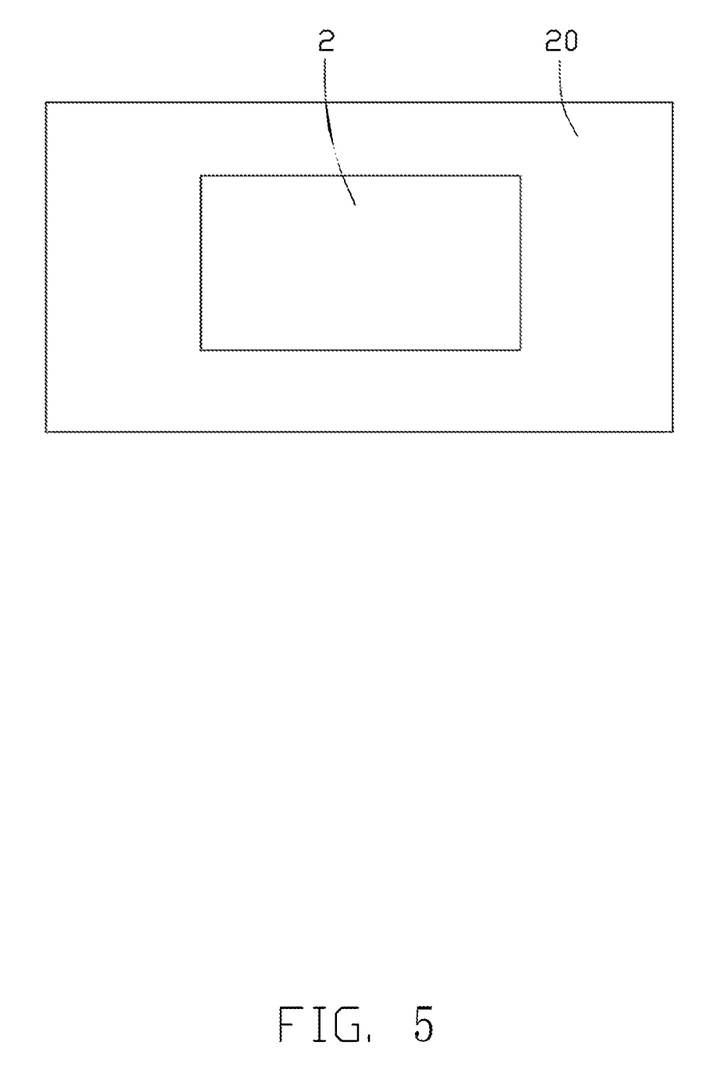
FIG. 5 is a vertical view of the VCSEL device of FIG. 1.

Referring to FIG. 5, the VCSEL device 100 further includes a substrate 20. At least one device unit 40 is disposed on the substrate 20. The substrate 20 is disposed away from the ohmic contact layer 2 on side of the positive electrode 3 and the negative electrode 6 of each device unit 40. The positive electrode 3 and the negative electrode 6 in each device unit 40 are electrically connected to the substrate 20.

In an embodiment, a pad 30 is disposed between one positive electrode 3 and the substrate 20, and between one negative electrode 6 and the substrate 20. The positive electrode 3 and the negative electrode 6 are electrically connected to the substrate 20 through their pads 30.

Figure 13:
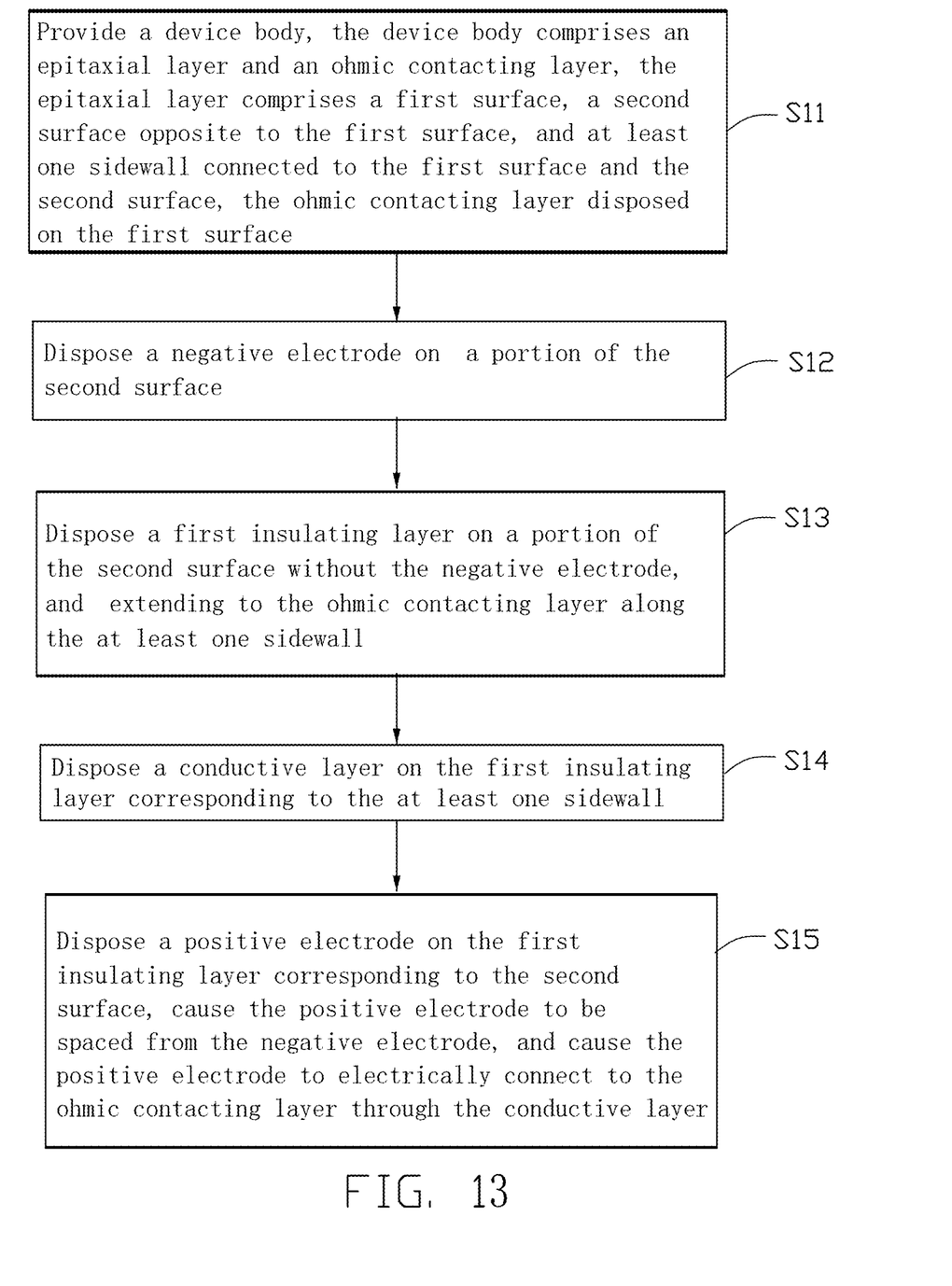
FIG. 13 is a flowchart of an embodiment of a method for manufacturing a VCSEL device according to the present disclosure.

Referring to FIG. 13, a method for manufacturing the VCSEL device is disclosed in one embodiment. The method is provided by way of example, as there are a variety of ways to carry out the method. The method can begin at block S11.

Figure 6:
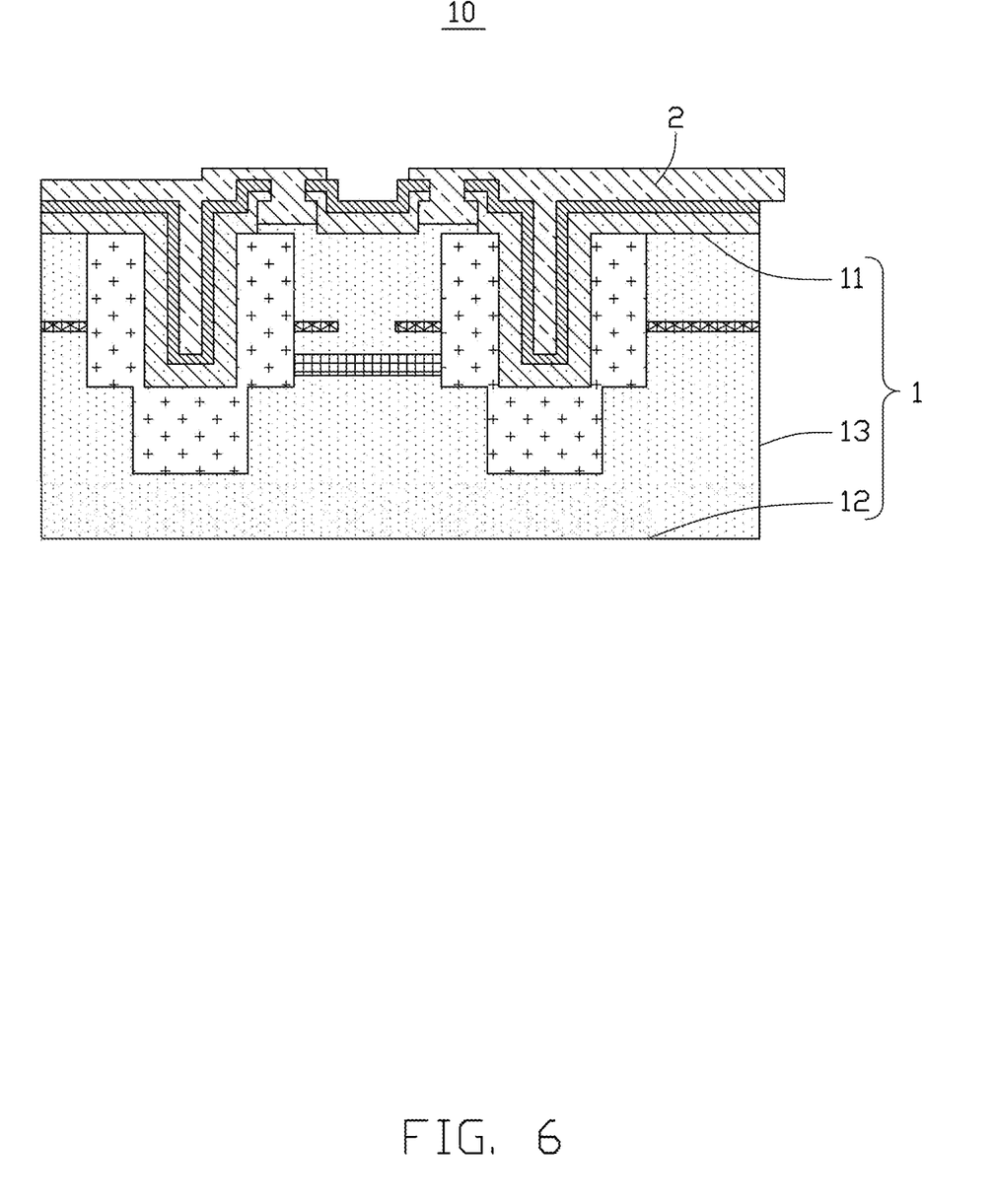
FIG. 6 is a diagrammatic view of a device body in the VCSEL device of FIG. 1.

At block S11, referring to FIG. 6, a device body 10 is provided.

The device body 10 includes the epitaxial layer 1 and the ohmic contact layer 2. The epitaxial layer 1 includes the first surface 11, the second surface 12 disposed opposite to the first surface 11, and the sidewall 13 connected to the first surface 11 and the second surface 12. The ohmic contact layer 2 is disposed on the first surface 11 away from the second surface 12.

In an embodiment, the device body 10 may be manufactured by traditional methods. The epitaxial layer 1 is formed by epitaxial growth. The ohmic contact layer 2 may be formed on the first surface 11 by physical vapor deposition technology (PVD) (or vacuum plating technology), or by etching.

Figure 7:
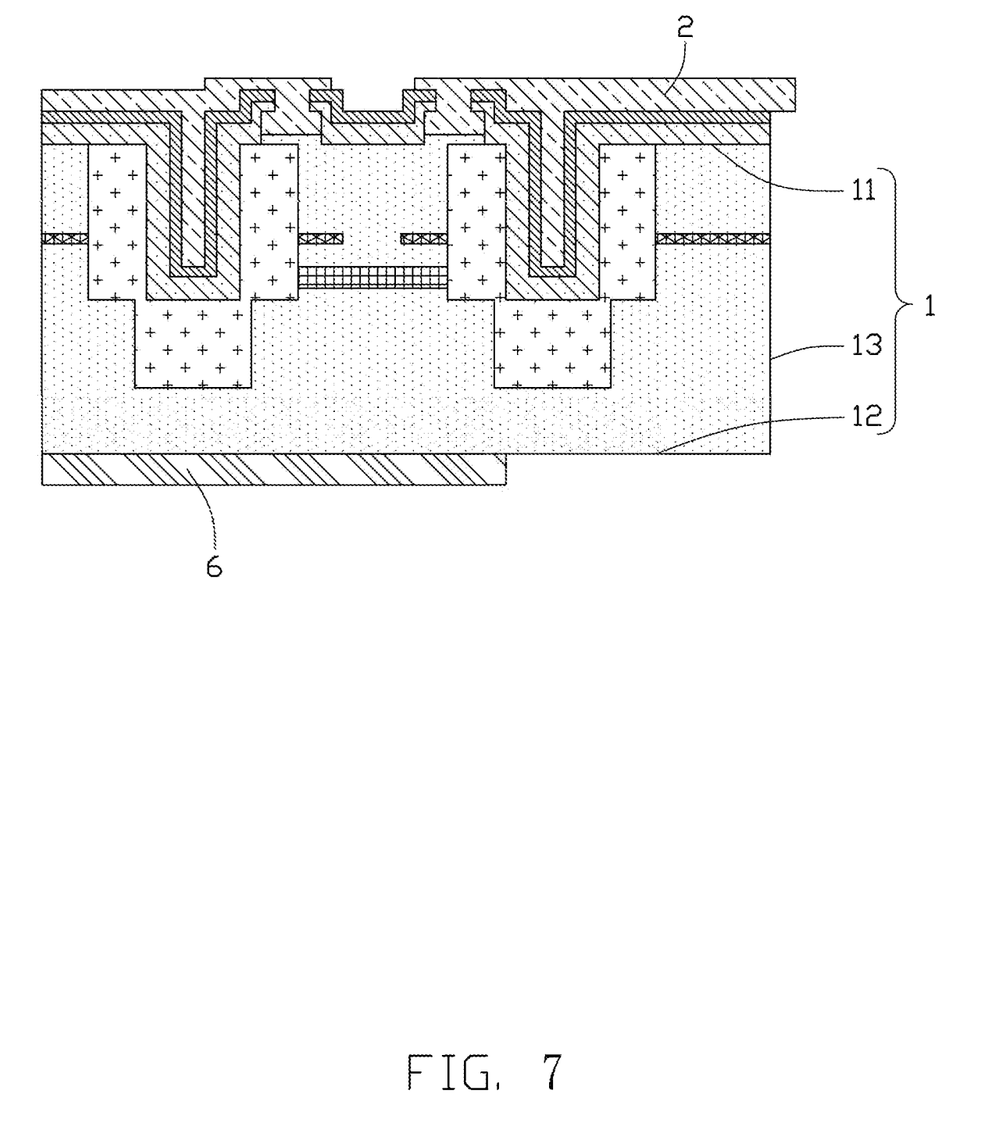
FIG. 7 is a diagrammatic view illustrating a negative electrode disposed on the device body of FIG. 6.

At block S12, referring to FIG. 7, the negative electrode 6 is disposed on a portion of the second surface 12 of the device body 10. The negative electrode 6 is electrically connected to the device body 10.

In an embodiment, the negative electrode 6 may be formed directly on the second surface 12 by physical vapor deposition technology (PVD) or vacuum plating technology, thereby the negative electrode 6 may be electrically connected to the second type semiconductor layer 16 of the epitaxial layer 1.

Figure 8:
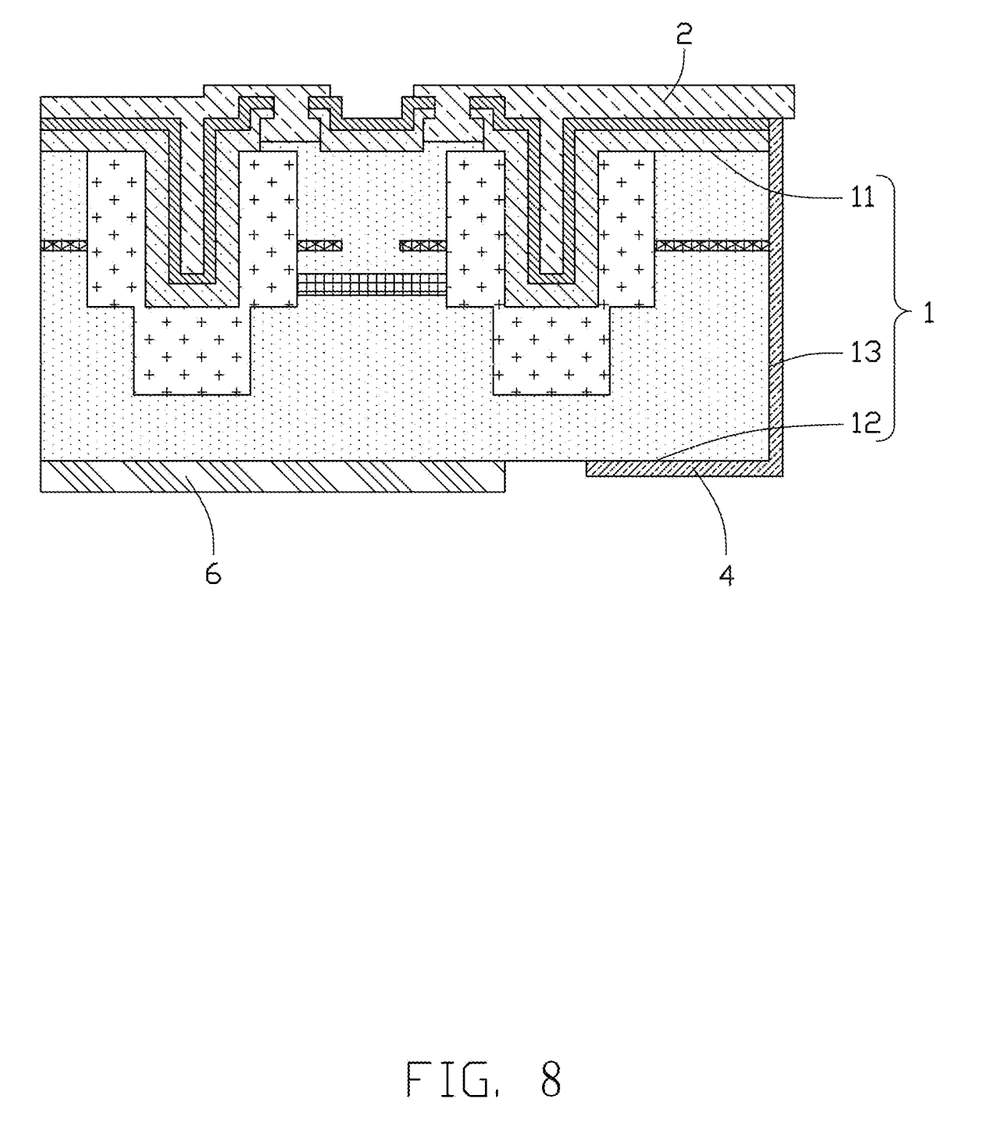
FIG. 8 is a diagrammatic view illustrating an insulating layer disposed on the device body of FIG. 7.

At block S13, referring to FIG. 8, the first insulating layer 4 is disposed on another portion of the second surface 12 which does not carry the negative electrode 6. The first insulating layer 4 further extends to a surface close to the epitaxial layer 1 of the ohmic contact layer 2 along the sidewall 13 to electrically connect to the ohmic contact layer 2.

In an embodiment, the first insulating layer 4 may be formed by physical vapor deposition technology (PVD).

In an embodiment, the first insulating layer 4 may be formed by depositing an alumina ($Al_2O_3$) film, which renders the coating of the first insulating layer 4 uniform, and the alumina film has high density, so as to achieve effective insulation between the positive electrode 3 and the epitaxial layer 1 even when using a very thin alumina film.

Figure 9:
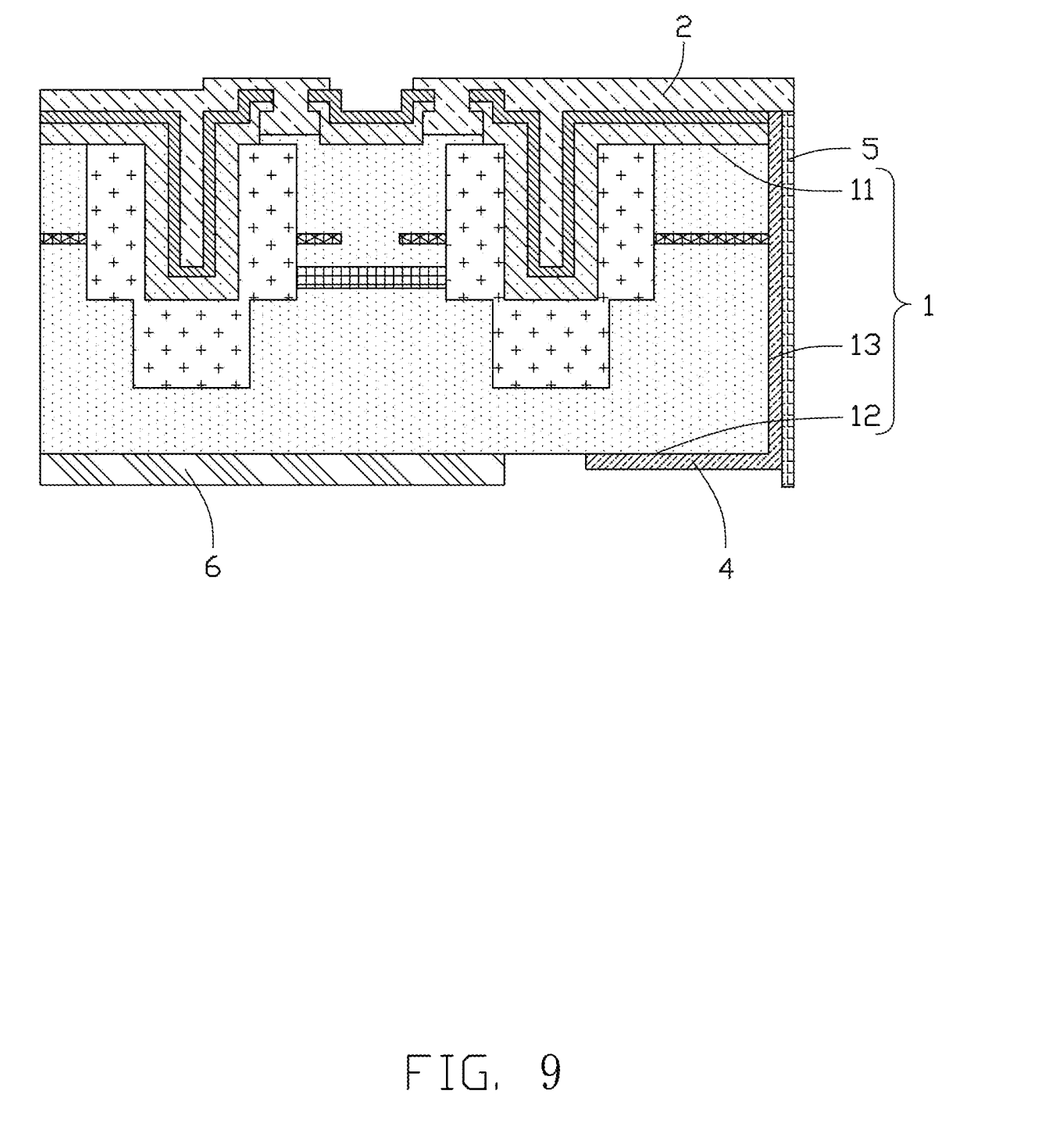
FIG. 9 is a diagrammatic view illustrating a conductive layer disposed on the insulating layer of FIG. 8.

At block S14, referring to FIG. 9, the conductive layer 5 is disposed on a surface of the first insulating layer 4 corresponding to the sidewall 13. The conductive layer 5 is electrically connected to the ohmic contact layer 2.

In an embodiment, the conductive layer 5 may be formed by physical vapor deposition technology (PVD) on the surface of the first insulating layer 4 away from the sidewall 13. The conductive layer 5 includes, but is not limited to, Cr, Al, Ti, and Cu.

Figure 10:
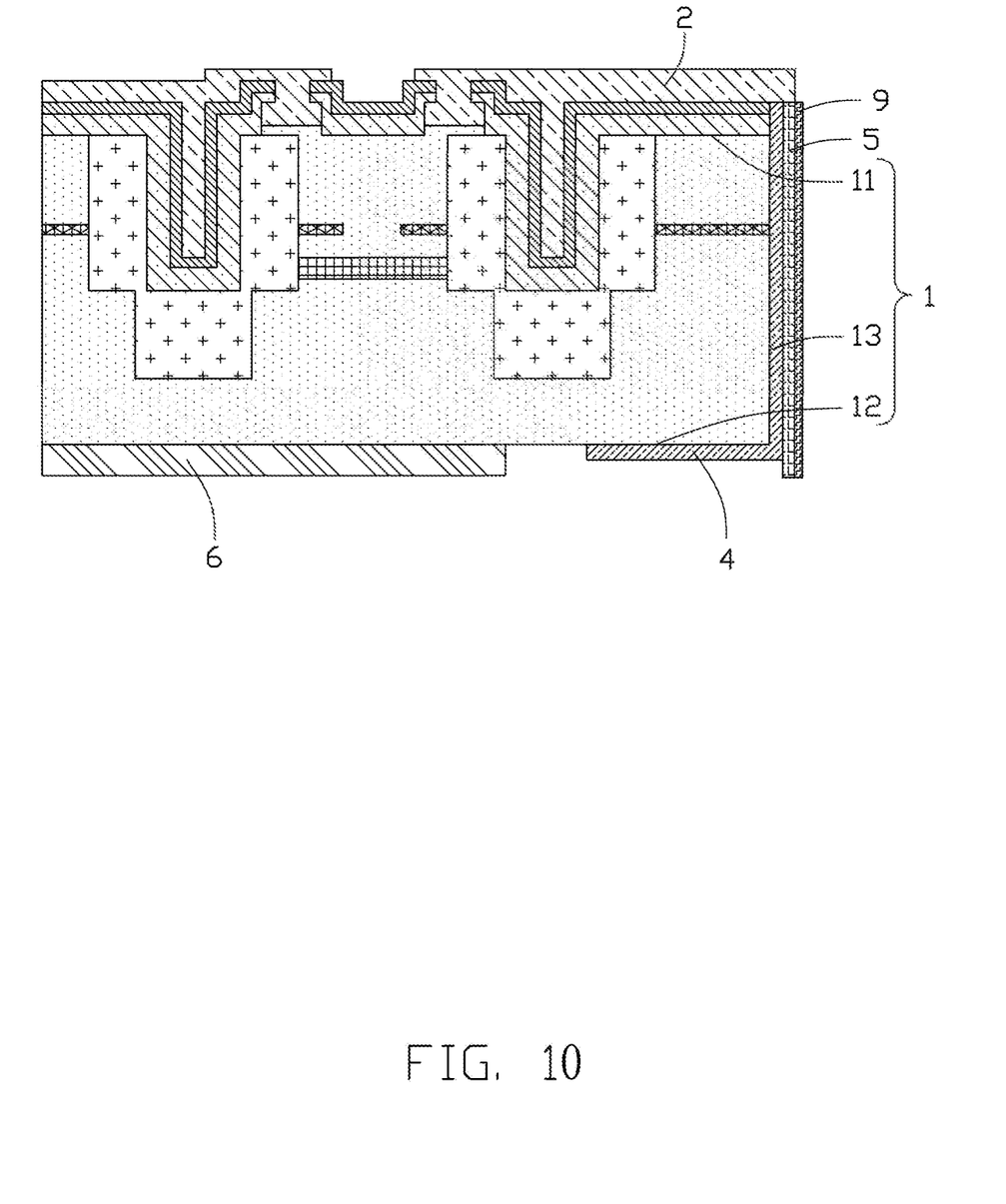
FIG. 10 is a diagrammatic view illustrating an electroplated coating disposed on the conductive layer of FIG. 9.

Referring to FIG. 10, in an embodiment, after the conductive layer 5 is disposed, an electroplated layer 9 is formed on the surface away from the first insulating layer 4 of the conductive layer 5 through electroplating with gold, so the electroplated layer 9 is firmly bonded to the gold-thickened conductive layer 5.

Figure 11:
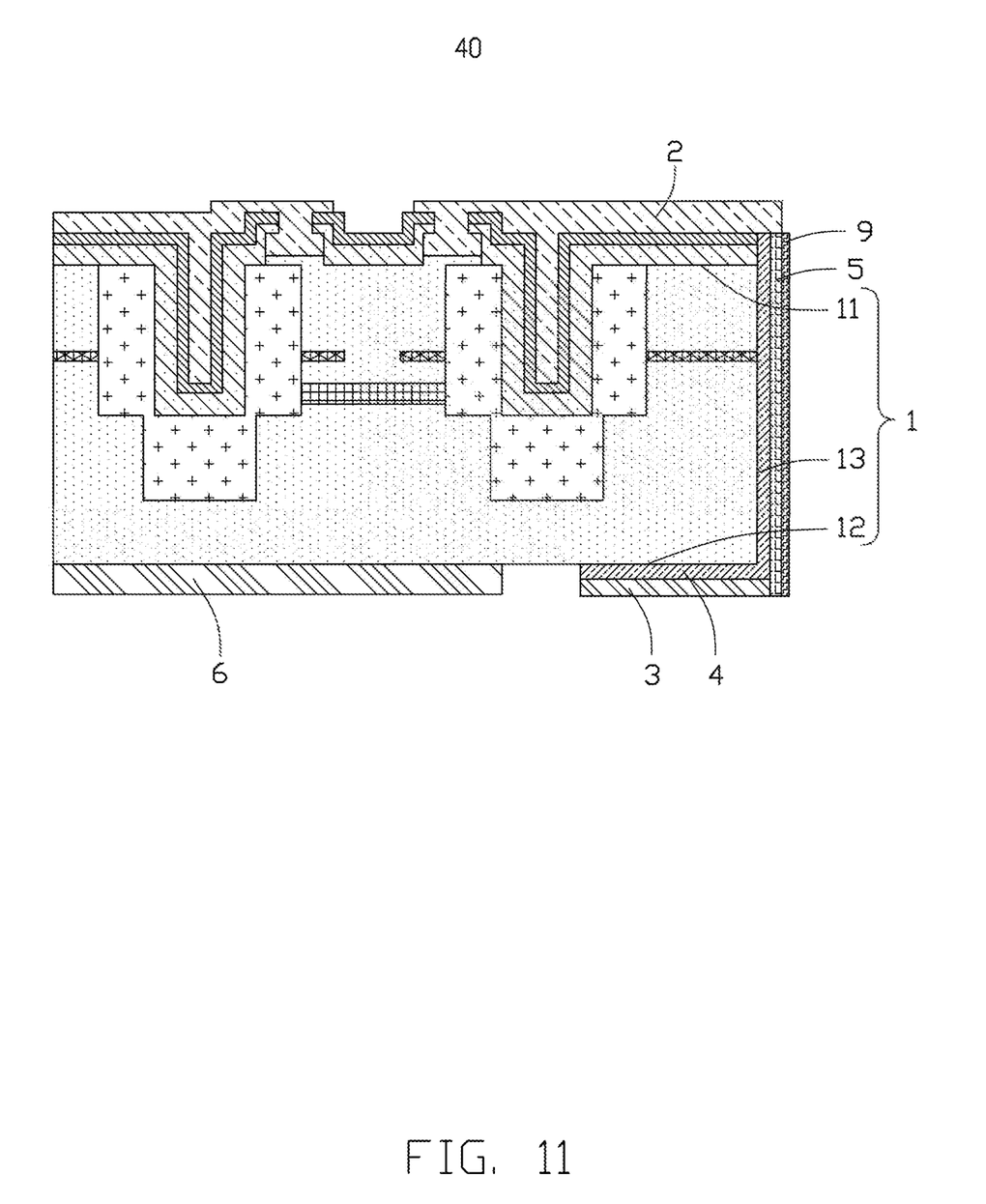
FIG. 11 is a diagrammatic view illustrating a positive electrode disposed on the insulating layer of FIG. 10.

At block S15, referring to FIG. 11, the positive electrode 3 is disposed on the surface away from the ohmic contact layer 2 of the first insulating layer 4 corresponding to the second surface 12. The positive electrode 3 is spaced from the negative electrode 6. The positive electrode 3 is electrically connected to the ohmic contact layer 2 through the conductive layer 5, and then electrically connected to the first semiconductor layer 14 of the epitaxial layer 1. Then, the device unit 40 is obtained.

In an embodiment, the positive electrode 3 on the surface of the first insulating layer 4 is provided by physical vapor deposition technology (PVD) or vacuum electroplating technology.

In an embodiment, referring to FIGS. 2 and 3, there is a gap 7 defined between the positive electrode 3 and the negative electrode 6. After forming the positive electrode 3, the method further includes following steps:

The second insulating layer 8 infills the gap 7 to isolate the positive electrode 3 from the negative electrode 6.

Figure 12:
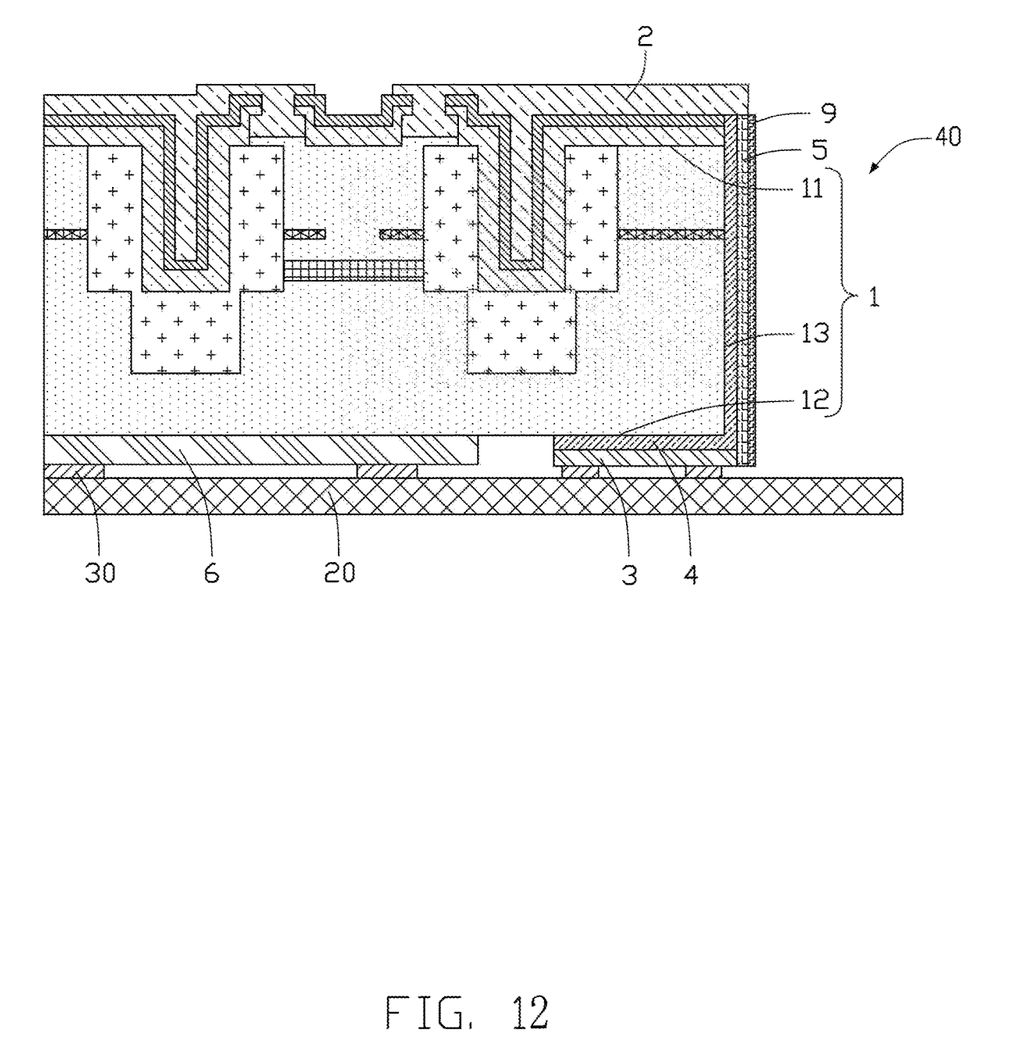
FIG. 12 is a diagrammatic view illustrating a substrate disposed on the positive electrode and the negative electrode of FIG. 11.

In an embodiment, referring to FIG. 12, the VCSEL device 100 further includes the substrate 20. After forming the positive electrode 3, the method further includes:

Referring to FIG. 12, the substrate 20 is provided. The at least one device unit 40 is disposed on the substrate 20. The positive electrode 3 and the negative electrode 6 in device unit 40 are each electrically connected to the substrate 20. Thereby, the VCSEL device 100 is obtained. In an embodiment, the positive electrode 3 and the negative electrode 6 are welded to the pad 30 of the substrate 20.

In sum, the positive electrode 3 and the negative electrode 6 are disposed on the second surface 12 of the epitaxial layer 1. The positive electrode 3 is electrically connected to the ohmic contact layer 2 through the conductive layer 5 on the sidewall 13, so that no wire bonding process is needed. Further, the elimination of a wire bonding area allows the size of the VCSEL device 100 to be reduced and the density of device units 40 on the substrate 20 may be increased. Moreover, since the positive electrode 3 and the negative electrode 6 are disposed on the same surface of the epitaxial layer 1, the overall thickness of the VCSEL device 100 is reduced.

Although the embodiments of the present disclosure have been shown and described, those having ordinary skill in the art can understand that changes may be made within the principles of the present disclosure, up to and including the full extent established by the broad general meaning of the terms used in the claims. It will, therefore, be appreciated that the embodiments described above may be modified within the scope of the claims.

What is claimed is:

1. A vertical cavity surface emitting laser (VCSEL) device, comprising:
   an epitaxial layer being rectangular which comprising a first surface, a second surface opposite to the first surface, and four sidewalls connected to the first surface and the second surface;
   an ohmic contact layer disposed on the first surface;
   a negative electrode disposed on a portion of the second surface;
   a first insulating layer disposed on a portion of the second surface without the negative electrode, and extending to the ohmic contact layer along each of the four sidewalls;
   a positive electrode disposed on the first insulating layer corresponding to the second surface, the positive electrode and the negative electrode spaced apart, the positive electrode surrounding the negative electrode;
   four conductive layers disposed on the first insulating layer corresponding to the four sidewalls; and
   an electroplating layer disposed on a surface of each of the four conductive layers away from the first insulating layer;
   wherein the positive electrode is connected to the ohmic contact layer through the four conductive layers and the electroplating layer, the negative electrode is spaced from the positive electrode.

2. The VCSEL device of claim 1, further comprising a second insulating layer filled between the positive electrode and the negative electrode.

3. The VCSEL device of claim 2, wherein the second insulating layer is made of polyamide or benzocyclobutene polymer.

4. The VCSEL device of claim 1, wherein the first insulating layer is an aluminum oxide film.

5. The VCSEL device of claim 1, wherein the conductive layer is made of a metal selected from a group consisting of chromium (CR), aluminum (AL), titanium (TI), copper (Cu), and any combination thereof.

6. The VCSEL device of claim 1, wherein the epitaxial layer comprises a first semiconductor layer, a second semiconductor layer, and an active layer between the first and the second semiconductor layers, the first semiconductor layer defines the first surface, the second semiconductor layer defines the second surface, the positive electrode is electrically connected to the first semiconductor layer through the ohmic contact layer, and the negative electrode is electrically connected to the second semiconductor layer.

7. The VCSEL device of claim 1, further comprising a substrate disposed on a side of the positive electrode and the negative electrode away from the ohmic contact layer,
   wherein the positive electrode and the negative electrode are electrically connected to the substrate.

8. The VCSEL device of claim 7, wherein the positive electrode and the negative electrode are electrically connected to the substrate through two pads, respectively.

9. A method of manufacturing a VCSEL device, comprising:
   providing a device body, the device body comprising an epitaxial layer and an ohmic contact layer, the epitaxial layer being rectangular which comprising a first surface, a second surface opposite to the first surface, and four sidewalls connected to the first surface and the second surface, the ohmic contact layer disposed on the first surface;
   disposing a negative electrode on a portion of the second surface;
   disposing a first insulating layer on a portion of the second surface without the negative electrode, and extending to the ohmic contact layer along each of the four sidewalls, the first insulating layer being an aluminum oxide film;
   disposing four conductive layers on the first insulating layer corresponding to each of the four sidewalls;

disposing an electroplating layer on a surface of each of the four conductive layers away from the first insulating layer; and disposing a positive electrode on the first insulating layer corresponding to the second surface, causing the positive electrode to be spaced from the negative electrode, the positive electrode surrounding the negative electrode, and causing the positive electrode to electrically connect to the ohmic contact layer through the four conductive layers and the electroplating layer.

10. The method of claim 9, wherein after forming the positive electrode, the method further comprises:

providing a substrate, the positive electrode and the negative electrode electrically connected to the substrate.

11. The method of claim 10, wherein the positive electrode and the negative electrode are electrically connected to the substrate through welding.

12. The method of claim 9, wherein after forming the positive electrode, the method further comprises:

filling a second insulating layer between the positive electrode and the negative electrode to isolate the positive electrode from the negative electrode.

13. The method of claim 12, wherein the second insulating layer is made of polyamide or benzocyclobutene polymer.

14. The method of claim 9, wherein the first insulating layer is an aluminum oxide film formed by physical vapor deposition technology (PVD).

15. The method of claim 9, wherein the conductive layer is formed by PVD.

16. The method of claim 9, wherein the epitaxial layer comprises a first semiconductor layer, a second semiconductor layer, and an active layer between the first and the second semiconductor layers, the first semiconductor layer defines the first surface, the second semiconductor layer defines the second surface, the positive electrode is electrically connected to the first semiconductor layer through the ohmic contact layer, and the negative electrode is electrically connected to the second semiconductor layer.

* * * * *